(12) United States Patent
Kluge

(10) Patent No.: US 8,980,398 B2
(45) Date of Patent: Mar. 17, 2015

(54) COMPONENT HAVING A CERAMIC BASE WITH A METALIZED SURFACE

(75) Inventor: Claus Peter Kluge, Röslau (DE)

(73) Assignee: CeramTec GmbH, Plochingen (DE)

( * ) Notice: Subject to any disclaimer, the term of this patent is extended or adjusted under 35 U.S.C. 154(b) by 951 days.

(21) Appl. No.: 12/596,864

(22) PCT Filed: Apr. 17, 2008

(86) PCT No.: PCT/EP2008/054626
§ 371 (c)(1),
(2), (4) Date: Oct. 23, 2009

(87) PCT Pub. No.: WO2008/128945
PCT Pub. Date: Oct. 30, 2008

(65) Prior Publication Data
US 2010/0089625 A1    Apr. 15, 2010

(30) Foreign Application Priority Data
Apr. 24, 2007    (DE) .......................... 10 2007 019 633

(51) Int. Cl.
*H05K 1/02*    (2006.01)
*B32B 15/04*    (2006.01)
(Continued)

(52) U.S. Cl.
CPC ............. *C04B 37/026* (2013.01); *C04B 37/021* (2013.01); *H01L 23/13* (2013.01); *H01L 23/367* (2013.01); *H01L 23/3735* (2013.01); *H05K 1/0203* (2013.01); *H05K 1/0284* (2013.01); *H05K 1/0306* (2013.01); *C04B 2237/121* (2013.01); *C04B 2237/122* (2013.01); *C04B 2237/123* (2013.01); *C04B 2237/124* (2013.01); *C04B 2237/125* (2013.01); *C04B 2237/34* (2013.01); *C04B 2237/343* (2013.01); *C04B 2237/348* (2013.01); *C04B 2237/365* (2013.01); *C04B 2237/366* (2013.01); *C04B 2237/368* (2013.01); *H01L 2224/48091* (2013.01); *H01L 2224/48227* (2013.01); *H01L 2924/01012* (2013.01); *H01L 2924/0102* (2013.01); *H01L 2924/01046* (2013.01); *H01L 2924/01078* (2013.01); *H01L 2924/01079* (2013.01); *H05K 1/181* (2013.01); *H05K 2201/09045* (2013.01); *H01L 24/48* (2013.01); *H01L 2924/01019* (2013.01); *H01L 2924/01021* (2013.01); *H01L 2924/01068* (2013.01); *H01L 2924/01087* (2013.01)
USPC ........... 428/120; 428/119; 428/450; 428/472; 428/469; 428/698; 428/702; 428/704

(58) Field of Classification Search
None
See application file for complete search history.

(56) References Cited

U.S. PATENT DOCUMENTS 2,326,534 A * 8/1943 Haberstump .................... 4/594
4,769,690 A * 9/1988 Suzuki et al. ................. 257/744
(Continued)

FOREIGN PATENT DOCUMENTS

| DE | 3709200 A | * | 9/1988 | |
|---|---|---|---|---|
| DE | 10 2004 012231 | | 9/2005 | |
| JP | 01111360 A | * | 4/1989 | ............. H01L 23/36 |
| JP | 02132847 A | * | 5/1990 | ............. H01L 23/36 |
| JP | 03036754 A | * | 2/1991 | ............ H01L 23/373 |

(Continued)

*Primary Examiner* — David Sample
(74) *Attorney, Agent, or Firm* — Norton Rose Fulbright US LLP

(57) ABSTRACT

A component which dissipates heat produced during operation thereof has a ceramic base the surface of which is covered in at least one area by a metalized coating, the ceramic base being spatially structured.

16 Claims, 1 Drawing Sheet

(51) Int. Cl.
  *B32B 17/00* (2006.01)
  *B32B 27/00* (2006.01)
  *B32B 5/00* (2006.01)
  *F28F 7/00* (2006.01)
  *C04B 37/02* (2006.01)
  *H01L 23/13* (2006.01)
  *H01L 23/367* (2006.01)
  *H01L 23/373* (2006.01)
  *H05K 1/03* (2006.01)
  *H05K 1/18* (2006.01)
  *H01L 23/00* (2006.01)

(56) References Cited

U.S. PATENT DOCUMENTS

| | | | |
|---|---|---|---|
| 4,819,857 A * | 4/1989 | Mizuishi et al. | 228/121 |
| 5,703,397 A | 12/1997 | Endo et al. | |
| 2002/0117683 A1 | 8/2002 | Takeuchi | |
| 2007/0236883 A1 * | 10/2007 | Ruiz | 361/699 |
| 2007/0264463 A1 | 11/2007 | Schulz-Harder et al. | |

FOREIGN PATENT DOCUMENTS

| | | | | |
|---|---|---|---|---|
| JP | 03082060 A | * | 4/1991 | H01L 23/34 |
| JP | 10284808 A | * | 10/1998 | H05K 1/02 |

* cited by examiner

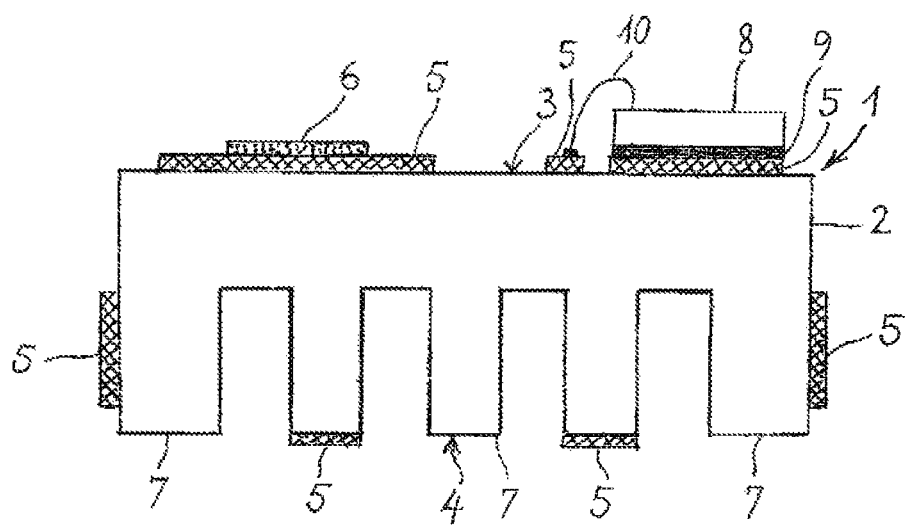

COMPONENT HAVING A CERAMIC BASE WITH A METALIZED SURFACE

This application is a §371 of PCT/EP2008/054626 filed Apr. 17, 2008, and claims priority from DE 10 2007 019 633.6 filed Apr. 24, 2007.

FIELD OF THE INVENTION

The invention relates to a component having a body made from ceramic material which is covered in at least one region on its surface with a metallized coating.

BACKGROUND OF THE INVENTION

A plate-shaped metallized ceramic substrate consisting of a ceramic layer which on at least one surface side has at least one metallized coating in the form of a foil or layer of copper or a copper alloy put on using the DCB (direct copper bonding) technique is known from DE 10 2004 012 231 B1.

The dissipation of the heat that develops during operation in the case of components with plate-shaped metallized ceramic bodies is difficult, in particular if the ceramic bodies are metallized on both sides.

The object of the invention consists in putting forward a component that has a ceramic body that is metallized on its surface with good heat dissipation.

OBJECTS AND SUMMARY OF THE INVENTION

The object is achieved with the aid of the present invention. Advantageous developments of the invention are described herein.

BRIEF DESCRIPTION OF THE FIGURE

The FIGURE shows an embodiment of a component according to the present invention.

DETAILED DESCRIPTION

The component in accordance with the invention is spatially structured. Instead of a plate, the ceramic body is a three-dimensional structure. Thus, further bodies of any form can be connected to a body, for example in the shape of a plate. The whole body, however, is in one piece, that is, it is not composed of individual parts. If, for example, further plates stand perpendicularly on a plate, a whole body that is E-shaped develops. Heat sinks, for example, have such a form.

The body of the component consists of a ceramic material which can be matched in its composition to the required properties, for example insulation, partial-discharge resistance and thermal stability. The ceramic material contains as a main component 50.1% by weight to 100% by weight $ZrO_2/HfO_2$ or 50.1% by weight to 100% by weight $Al_2O_3$ or 50.1% by weight to 100% by weight AlN or 50.1% by weight to 100% by weight $Si_3N_4$ or 50.1% by weight to 100% by weight BeO, 50.1% by weight to 100% by weight SiC or a combination of at least two of the main components in any combination in the specified range of proportions and also as a secondary component the elements Ca, Sr, Si, Mg, B, Y, Sc, Ce, Cu, Zn, Pb in at least one oxidation stage and/or compound with a proportion of ≤49.9% by weight individually or in any combination in the specified range of proportions. The main components and the secondary components, discounting a proportion of impurities of ≤3% by weight, can be combined with each other in any combination with each other to give a total composition of 100% by weight.

The coefficient of thermal expansion of the ceramic material of the component without metallization is smaller than $12 \times 10^{-6}$/K. The bending strength of the ceramic body is greater than 100 MPa, and the thermal conductivity of the material is greater than 1 W/mK. As a result, the loading of the metallized coating by a thermally conditioned expansion of the ceramic material is low. By way of the ceramics, in particular in the case of the metallized coating with copper, the latter's high coefficient of thermal expansion is reduced and thus approximated to the coefficient of thermal expansion of the semiconductor materials of an electronic structural element connected to the metallized coating. As a result, the stresses that occur during heating in the materials of a semiconductor structural element are avoided.

Metals or metal layers are preferably connected as the metallized coating to the ceramic body in an intimate manner or by means of mechanical form-locking over the whole or part of the surface, the metals having the same or different thermal conductivity as or from the carrier body. The metallized coating can, for example, consist of tungsten, silver, gold, copper, platinum, palladium, nickel, aluminium or steel of pure or industrial quality or of mixtures of at least two different metals. The metallized coating can, for example, also, additionally or merely, consist of reaction solders, soft solders or hard solders.

The metals or metal layers of the metallized coating can also be mixed, for example, with adhesion-promoting substances or other additives, such as glasses or polymeric materials, in order to increase the adhesiveness of the metallized coating on the ceramic body.

The layer or the layers of the metallized coating have been put on the surface of the body on opposing and/or adjacent faces with use of a DCB (direct copper bonding) method or an AMB (active metal brazing) method or a screen-printing method or an electrolytic method or chemical deposition or a vaporization method or by means of adhesion or gluing or a combination of these methods.

The metallized coating on the ceramic body consists of at least one layer per metallized face. The metallized coating covers the surface of the ceramic body as a metal body over part of or the whole surface or partly or completely in a plane-parallel or almost plane-parallel form or in a manner protruding in any geometrical form or in combinations of the forms.

The thickness of the at least one layer of the metallized coating is ≤2 mm, its adhesive strength greater than 20 N/cm. Self-detachment of the layers on account of thermal loading is thus precluded.

The ceramic body is covered on at least two of its surfaces with a metallized coating. The metallized coating has a minimum thermal conductivity of 100 W/mK. In the case of high thermal loading by structural elements or circuit arrangements, good heat-dissipation is thus guaranteed.

In the case of a component with at least one metallized coating on at least one surface, the bending strength is greater than 550 MPa. In the case of thermal loading, flaking-off of the metallized coating and the destruction of the ceramic body by tensile and pressure forces of the metallized coating are precluded.

The ceramic body of the component is preferably formed as a heat sink. What is understood by a heat sink is a body which bears electrical or electronic structural elements or circuit arrangements and which is formed in such a way that it can dissipate the heat that develops in the structural elements or circuit arrangements in such a way that no accumulation of heat develops that can do damage to the structural elements or circuit arrangements. The carrier body is a body made from a material which electrically is not or is almost not conductive and has good thermal conductivity. The ideal material for such a body is ceramic material.

The body is in one piece and has heat-dissipating or heat-supplying elements to protect the electronic structural elements or circuit arrangements. The carrier body is preferably a printed circuit board, and the elements are bores, channels, ribs and/or clearances on which a heating or cooling medium can act. The medium can be liquid or gaseous. The carrier body and/or the cooling element preferably consist/consists of at least one ceramic component or a composite of different ceramic materials.

The invention is explained in greater detail with reference to an exemplary embodiment. It presents a component 1 which has a ceramic body 2 which in accordance with the invention is not plate-shaped. Being not plate-shaped means that the upper side 3 and the lower side 4 of the ceramic body 2 are formed in such a way that they each have surfaces of differing size. The body is spatially structured. The upper side 3 of the component 1 in the present exemplary embodiment has a planar surface. Various metallized regions 5 are put on this upper side 3. The upper side 3 is a circuit-carrier. Applied to at least one metallized coating 5 on the upper side 3 of the ceramic body 2 there is at least one further metallized coating 6 which in the present case covers over part of the surface of the first metallized coating 5.

In the present exemplary embodiment the ceramic body 2 is E-shaped. The body is a heat sink. The lower side 4 of the ceramic body 2 has cooling ribs 7. The cooling ribs 7 are also provided with metallized regions. 5 onto which electronic components, for example, can be soldered.

On the surface 3 of the ceramic body 2 a chip 8 is secured on a metallized region 5 by means of a soldered connection 9. It is connected to a metallized region 5 by way of lines 10. This chip 8 represents a heat source, the heat of which is dissipated by way of the cooling ribs 7.

It is claimed:

1. A component comprising a ceramic body; said ceramic body comprising a planar upper side and a lower side having a plurality of cooling ribs, wherein said ceramic body comprises a ceramic material; a first metallized coating on each of said planar upper side and said lower side; and a further metallized coating on at least a part of a surface of the first metallized coating; wherein the ceramic material contains 50.1 to 100% by weight of at least one main component selected from the group consisting of $ZrO_2/HfO_2$, BeO and SiC, and ≤49.9% by weight of a secondary component selected from the group consisting of at least one element selected from the group consisting of Ca, Sr, Si, Mg, B, Y, Sc, Ce, Cu, Zn and Pb in at least one oxidation stage, and wherein the total weight of the main component and the secondary component, discounting a proportion of impurities of ≤3% by weight, is 100% by weight of the ceramic material.

2. A component according to claim 1, wherein the coefficient of thermal expansion of the ceramic material of the ceramic body without metallization is smaller than $12 \times 10^{-6}/K$.

3. A component according to claim 1, wherein metals or metal layers are connected as the metallized coating to the ceramic body in an intimate manner or by a mechanical form-locking over whole or part of the surface, the metals having the same or different thermal conductivity as or from the ceramic body.

4. A component according to claim 1, wherein the metallized coating comprises at least one metal selected from the group consisting of tungsten, silver, gold, copper, platinum, palladium, nickel, aluminum, steel and a solder.

5. A component according to claim 1, wherein the metals or metal layers of the metallized coating are mixed with adhesion-promoting substances or other additive.

6. A component according to claim 1, wherein the metallized coating on the ceramic body consists of at least one layer, and in that this layer is put on the surface of the body on opposing or adjacent faces with use of a Direct Copper Bonding (DCB) method or an Active Metal Brazing (AMB) method or a screen-printing method or an electrolytic method or chemical deposition or a vaporization method or by means of adhesion or gluing or a combination of these methods.

7. A component according to claim 1, wherein the metallized coating covers over the surface of the ceramic body as a metal body over part of or the whole surface or partly or completely in a plane-parallel or almost plane-parallel form or in a manner protruding in any geometrical form or in combinations of the forms.

8. A component according to claim 1, wherein the metallized coating has an adhesive strength that is greater than 20 N/cm.

9. A component according to claim 1, wherein the thickness of the metallized coating amounts to ≤2 mm.

10. A component according to claim 1, wherein the bending strength of the component is greater than 550 MPa.

11. A component according to claim 3, wherein the coefficient of thermal expansion of the ceramic material of the ceramic body without metallization is smaller than $12 \times 10^{-6}/K$.

12. A component according to claim 1, wherein the metallized coating has a minimum thermal conductivity of 100 W/mk.

13. A component according to claim 1, wherein mounted on the metallized coating on the ceramic body there is at least one active or passive electronic component.

14. A component according to claim 1, wherein mounted on the metallized coating on the ceramic body there is at least one active or passive electronic component which by way of soldered or bonded connections at least one point is electrically or thermally connected to the first metallized coating provided on the ceramic body.

15. A component according to claim 1, wherein the bending strength of the ceramic body is greater than 100 MPa, and the thermal conductivity of the ceramic material is greater than 1 W/mK.

16. A component comprising a ceramic body having at least two adjacent or opposing faces; said ceramic body having a planar upper side and a lower side comprising a plurality of cooling ribs; said planar upper side and a surface of at least one cooling rib having a first metallized coating thereon, wherein the ceramic body comprises a ceramic material, and wherein the ceramic material contains 50.1 to 100% by weight of at least one main component selected from the group consisting of $ZrO_2/HfO_2$, BeO and SiC, and ≤49.9% by weight of a secondary component selected from the group consisting of at least one element selected from the group consisting of Ca, Sr, Si, Mg, B, Y, Sc, Ce, Cu, Zn and Pb in at least one oxidation stage, and wherein the total weight of the main component and the secondary component, discounting a proportion of impurities of ≤3% by weight, is 100% by weight of the ceramic material.

\* \* \* \* \*